United States Patent
Howard et al.

(10) Patent No.: US 8,680,403 B2
(45) Date of Patent: Mar. 25, 2014

(54) APPARATUS FOR BROADBAND MATCHING

(75) Inventors: Gregory E. Howard, Plano, TX (US); Modesto Garcia, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 363 days.

(21) Appl. No.: 13/228,158

(22) Filed: Sep. 8, 2011

(65) Prior Publication Data

US 2013/0062105 A1    Mar. 14, 2013

(51) Int. Cl.
*H05K 1/11* (2006.01)
*H05K 7/00* (2006.01)

(52) U.S. Cl.
USPC ........... 174/261; 174/262; 361/760; 361/777; 361/782

(58) Field of Classification Search
USPC ......... 174/250, 257, 260–262, 264, 266, 268; 361/760, 763, 766, 777, 780, 782, 794, 361/799, 800
See application file for complete search history.

(56) References Cited

U.S. PATENT DOCUMENTS

| | | | | |
|---|---|---|---|---|
| 6,555,763 | B1* | 4/2003 | Hirasawa et al. | 174/264 |
| 6,803,655 | B2* | 10/2004 | Fujio et al. | 257/724 |
| 6,992,374 | B1 | 1/2006 | Yang et al. | |
| 7,183,491 | B2* | 2/2007 | Ishikawa | 174/255 |
| 7,382,629 | B2* | 6/2008 | Hsu | 361/794 |
| 7,623,353 | B2 | 11/2009 | Edmonson et al. | |
| 7,975,251 | B2* | 7/2011 | Fujimori | 716/127 |
| 2006/0044734 | A1 | 3/2006 | Ahn et al. | |
| 2006/0065433 | A1* | 3/2006 | Danoski et al. | 174/255 |

* cited by examiner

*Primary Examiner* — Hoa C Nguyen
(74) *Attorney, Agent, or Firm* — Alan A. R. Cooper; W. James Brady, III; Frederick J. Telecky, Jr.

(57) ABSTRACT

An apparatus is provided. The apparatus comprises a substrate and a circuit trace. The substrate includes a region that is adapted to receive a discrete component, a metal layer, a dielectric layer formed over the metal layer, a window formed in the metal layer that underlies the region, and a conductive strap that extends across the window. The circuit trace is formed on the dielectric layer and is discontinuous across the region.

11 Claims, 3 Drawing Sheets

US 8,680,403 B2

APPARATUS FOR BROADBAND MATCHING

TECHNICAL FIELD

The invention relates generally to a printed circuit board (PCB) and, more particularly, to a PCB having broadband matching structures.

BACKGROUND

For PCBs that operate at high frequencies (i.e. about 25 GHz), blocking capacitors are often employed. These discrete capacitors are usually placed in the signal flow path to block unwanted direct current (DC) signals. While these discrete capacitors (or other discrete components, like resistors) may (and usually do) represent a small impedance discontinuities due to the relatively small value (i.e., 1 µF represents 0.2 mΩ at 1 GHz), the discrete component is physically much larger that the trace or transmission line to which it is coupled; this physical size can cause a capacitive discontinuity in the transmission line or trace, which can limit the frequency performance.

One example of a conventional solution for this capacitive discontinuity is to make adjustments to the ground plane within the PCB, as shown in FIGS. 1 and 2. In this example, the discrete component 106 (which can, for example, be a capacitor) is coupled to trace 108 that is formed on PCB 102. Within the PCB 102, there is a metal layer that forms a ground plane 104. In a region that underlies the discrete component 106, there is a window 110 that is formed in the metal layer 104. The hole or window 110 in the metal layer 104 decreases coupling to ground by trace 108 and increases the inductance to ground for the ground return current. This has the overall impact of raising the impedance of the discontinuity so as to achieve better matching.

There is, however, a drawback to this conventional solution. Namely, there is a frequency limit under which this solution will function. Thus, there is a need for an apparatus that allows matching at higher frequency ranges.

Some examples of conventional solutions are: U.S. Pat. No. 6,992,374; U.S. Pat. No. 7,623,353; and U.S. Patent Pre-Grant Publ. No. 2006/0044734.

SUMMARY

A preferred embodiment of the present invention, accordingly, provides an apparatus. The apparatus comprises a substrate having: a region that is adapted to receive a discrete component; a metal layer; a dielectric layer formed over the metal layer; a window formed in the metal layer that underlies the region; a conductive strap that extends across the window; and a circuit trace formed on the dielectric layer and being discontinuous across the region.

In accordance with an embodiment of the present invention, the substrate further comprises a circuit board.

In accordance with an embodiment of the present invention, the dielectric layer further comprises a first dielectric layer, and wherein the metal layer is formed over a second dielectric layer.

In accordance with an embodiment of the present invention, the metal layer is formed of aluminum or copper.

In accordance with an embodiment of the present invention, the circuit trace is about 100 µm and has an impedance of about 50 Ω.

In accordance with an embodiment of the present invention, the window has a width that is greater than 500 µm.

In accordance with an embodiment of the present invention, an apparatus is provided. The apparatus comprises a printed circuit board (PCB) having: a first dielectric layer; a metal layer formed over the first dielectric layer; a second dielectric layer formed over the metal layer; a window formed in the metal layer; a conductive strap that extends across the window; a first portion of a circuit trace formed on the second dielectric layer; and a second portion of the circuit trace formed on the second dielectric layer, wherein the first and second portions of the circuit trace are separated from one another in a region that is substantially aligned with the window; a discrete component that is secured to the first and second portions of the circuit trace within a path that is substantially parallel to the conductive strap.

In accordance with an embodiment of the present invention, the discrete component is a resistor or a capacitor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
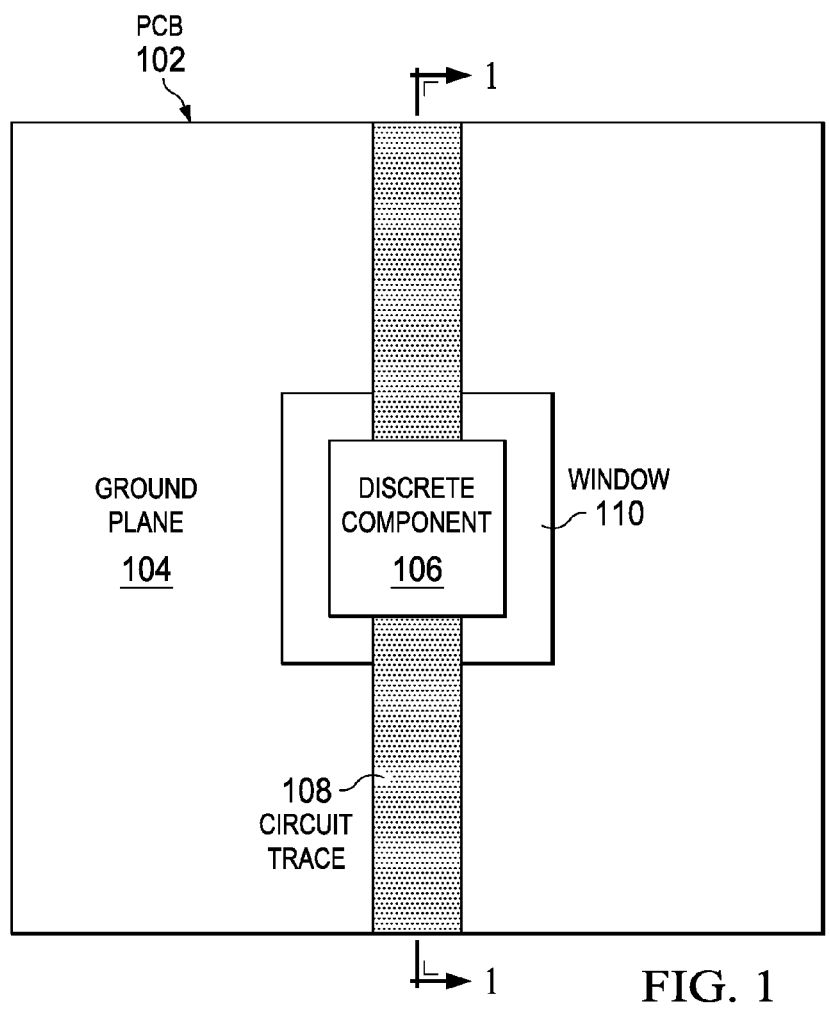
FIG. 1 is a diagram of an example of a PCB with a conventional broadband matching structure.

Refer now to the drawings wherein depicted elements are, for the sake of clarity, not necessarily shown to scale and wherein like or similar elements are designated by the same reference numeral through the several views.

Figure 3:
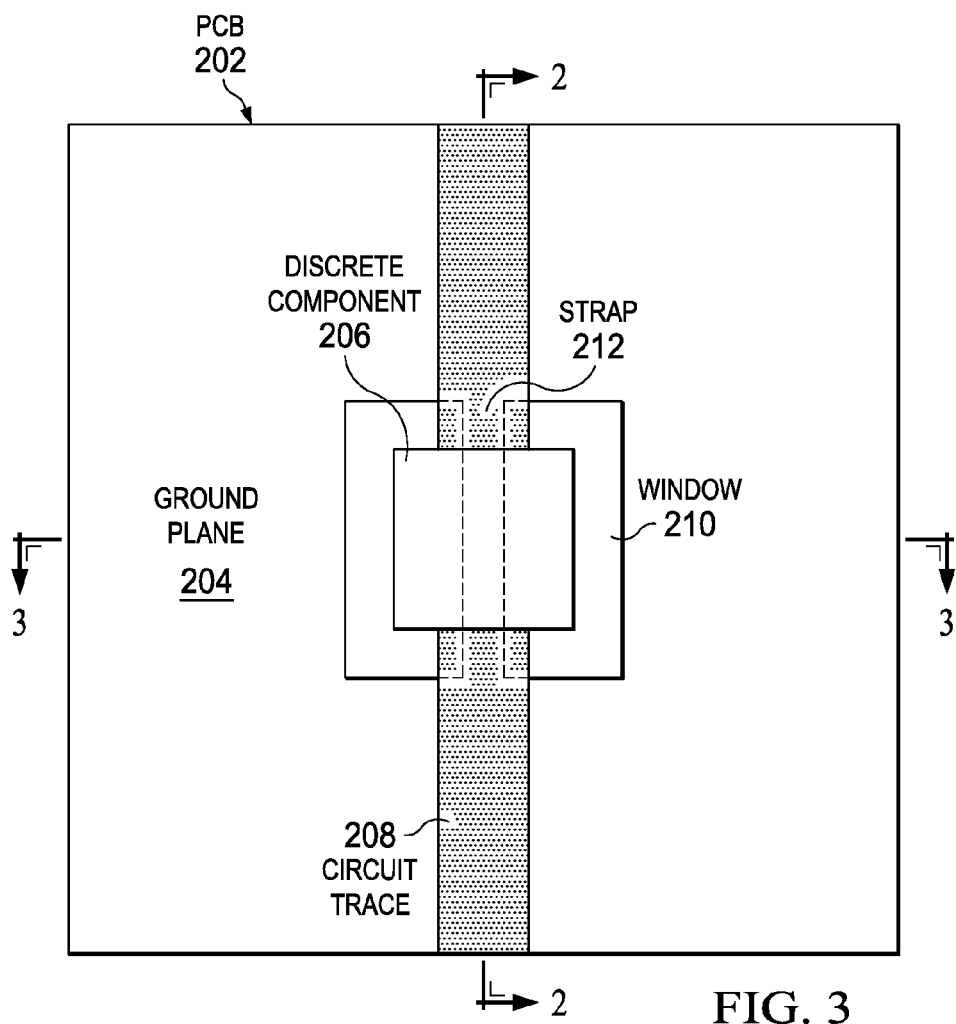
FIG. 3 is a diagram of an example of a PCB with a broadband matching structure in accordance with an embodiment of the present invention.
Figure 4:
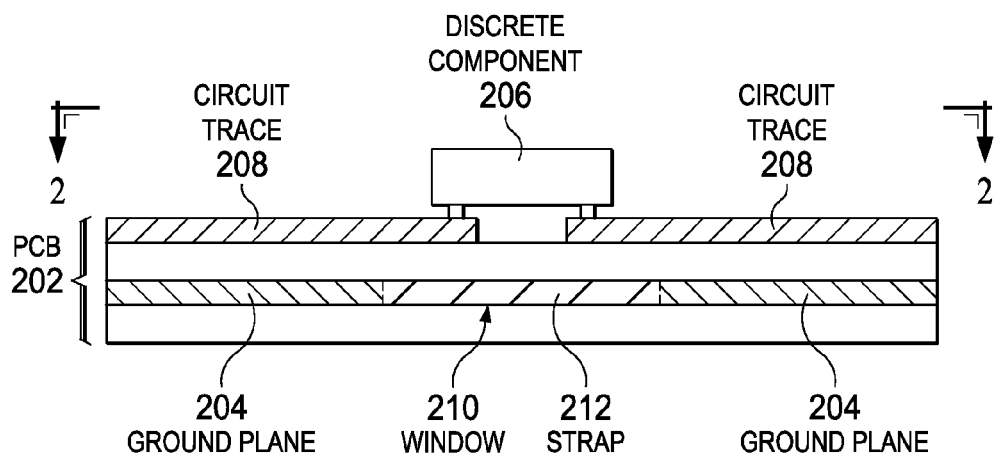
FIG. 4 is a cross-sectional view of the PCB of FIG. 3 along section line II-II.
Figure 5:
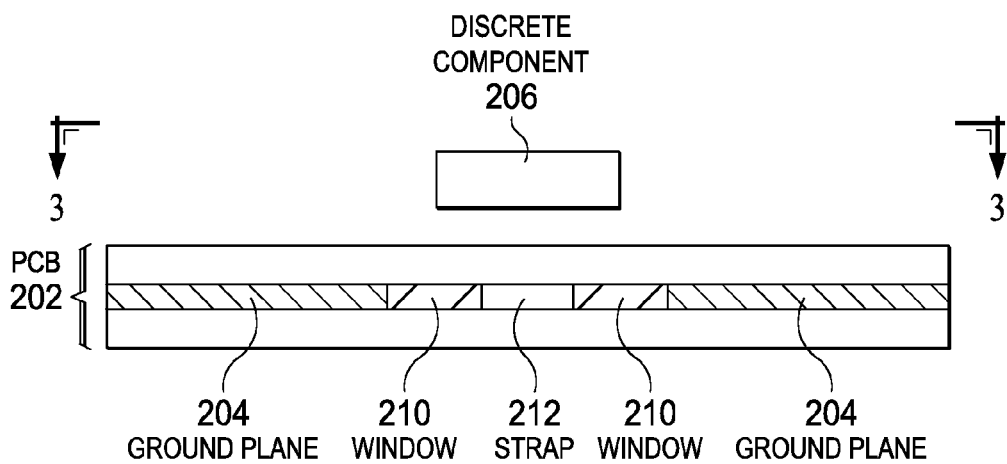
FIG. 5 is a cross-sectional view of the PCB of FIG. 3 along section line III-III.

Turning to FIGS. 3-5, an example of a PCB 202 with a broadband matching structure in accordance with an embodiment of the present invention can be seen. As shown, the PCB 202 is generally comprised of several layers, and, there is a metal layer 204 (which can be formed of, for example, aluminum or copper) sandwiched between dielectric layers. There can also be several additional dielectric and metal layers. Formed on the PCB 202 is circuit trace 208 (which can, for example, be about 100 µm wide and have a nominal impedance of about 50 Ω or may have an impedance between 30 Ω and 70 Ω for single-ended and 60 Ω and 140 Ω for differential). The circuit trace 208 has two portions that extend to a region that is adapted to receive discrete component 206 (which can, for example, be a discrete resistor or discrete capacitor and which can, for example, have a width of about 500 μm). The circuit trace 208 (which can, for example, have a width of about 50 μm, but is typically a function of the thickness of the dielectric layer(s) between the metal layer 204 and trace 208) is discontinuous in this region, and the discrete component 208 is coupled therebetween. In the metal layer 204, a window or hole 210 (which can, for example, have a width greater than 500 μm and usually about 1.5 mm by about 1.5 mm) is formed therein such that the window 210 underlies or is substantially aligned with the region that is adapted to receive the discrete component 206. Additionally, a strap 212 (which can be part of the metal layer 204) extends across the window 210. These windows 210 and straps 212 should also be included in any other plane (metal) layers within the PCB 202.

With strap 212, several advantages can be realized. This strap 212 provides a more direct return path for current within the ground plane (formed by metal layer 204), and, because the strap 212 has a narrow width, a small amount of capacitance is added, while the inductance to ground is increased. The shape of the strap 212 can also be varied (i.e., curvilinear) to increase inductance to a desired level without significantly affecting current flow. As a result of employing this strap 212, an impedance matching of 20 dB to 50 GHz and better than 12 dB up to 100 GHz, compared to 20 dB to 30 HGz and 12 dB to 40 GHz with the PCB of FIGS. 1 and 2.

Figure 2:
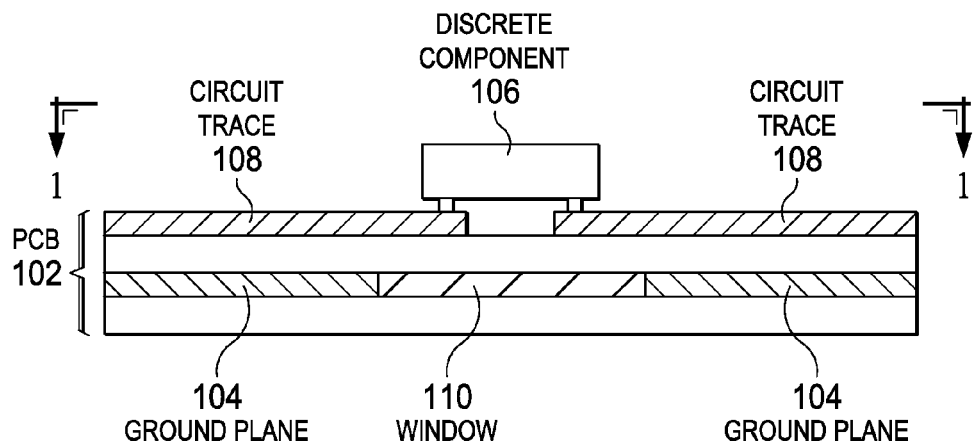
FIG. 2 is a cross-sectional view of the PCB of FIG. 1 along section line I-I.
Figure 6:
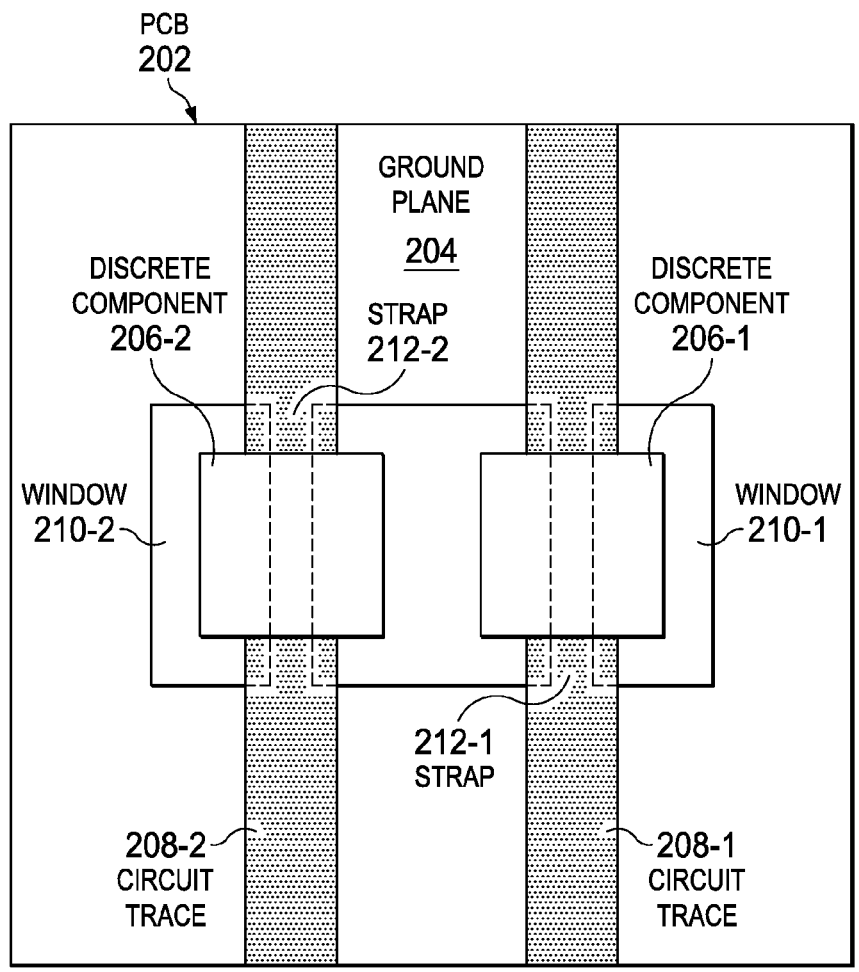
FIG. 6 is a diagram of an example of a PCB with a multiple broadband matching structures in proximity to one another.

With the system of FIGS. 1 and 2, having several traces (i.e., 108) located in proximity to one another may be problematic because the windows (i.e., 110) would disturb the ground plane 104 because of large discontinuities in the ground plane 104. By using the straps 201-1 and 206-2 (as shown in FIG. 6), the problem can be avoided. Because these straps 206-1 and 206-1-2 for two adjacent traces 208-1 and 208-2 (depicted in this example) provide current paths for the ground plane 204, the ground plane 204 would generally function normally (i.e., undisturbed). This allow for much higher density than would be achievable with the conventional system shown in FIGS. 1 and 2.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a substrate having:
        a region that is adapted to receive a discrete component;
        a metal layer;
        a dielectric layer formed over the metal layer;
        a window formed in the metal layer that underlies the region; and
        a conductive strap that extends across the window; and
        a circuit trace formed on the dielectric layer and being discontinuous across the region.

2. The apparatus of claim 1, wherein the substrate further comprises a circuit board.

3. The apparatus of claim 2, wherein the dielectric layer further comprises a first dielectric layer, and wherein the metal layer is formed over a second dielectric layer.

4. The apparatus of claim 3, wherein the metal layer is formed of aluminum or copper.

5. The apparatus of claim 4, wherein the circuit trace is about 100 μm and has an impedance of about 50 Ω.

6. The apparatus of claim 5, wherein the window has a width that is greater than 500 μm.

7. An apparatus comprising:
    a printed circuit board (PCB) having:
        a first dielectric layer;
        a metal layer formed over the first dielectric layer;
        a second dielectric layer formed over the metal layer;
        a window formed in the metal layer;
        a conductive strap that extends across the window;
        a first portion of a circuit trace formed on the second dielectric layer; and
        a second portion of the circuit trace formed on the second dielectric layer, wherein the first and second portions of the circuit trace are separated from one another in a region that is substantially aligned with the window;
    a discrete component that is secured to the first and second portions of the circuit trace within a path that is substantially parallel to the conductive strap.

8. The apparatus of claim 7, wherein the metal layer is formed of aluminum or copper.

9. The apparatus of claim 8, wherein the discrete component is a resistor or a capacitor.

10. The apparatus of claim 9, wherein the circuit trace is about 100 μm and has an impedance of about 50 Ω.

11. The apparatus of claim 10, wherein the window has a width that is greater than 500 μm.

* * * * *